US012751211B2

(12) United States Patent
van der Straten et al.

(10) Patent No.: US 12,751,211 B2
(45) Date of Patent: Sep. 29, 2026

(54) MRAM DEVICE WITH TUNNEL BARRIER OVERHANG

(71) Applicant: INTERNATIONAL BUSINESS MACHINES CORPORATION, Armonk, NY (US)

(72) Inventors: Oscar van der Straten, Guilderland Center, NY (US); Chih-Chao Yang, Glenmont, NY (US); Koichi Motoyama, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 390 days.

(21) Appl. No.: 18/472,289

(22) Filed: Sep. 22, 2023

(65) Prior Publication Data

US 2025/0107452 A1 Mar. 27, 2025

(51) Int. Cl.

| | |
|---|---|
| ***H10N 50/10*** | (2023.01) |
| ***G11C 11/16*** | (2006.01) |
| ***H10B 61/00*** | (2023.01) |
| ***H10N 50/01*** | (2023.01) |
| ***H10N 50/80*** | (2023.01) |

(52) U.S. Cl.
CPC ........... *H10N 50/10* (2023.02); *G11C 11/161* (2013.01); *H10B 61/22* (2023.02); *H10N 50/01* (2023.02); *H10N 50/80* (2023.02)

(58) Field of Classification Search
CPC .. H10B 61/20–22; H10N 50/10; H10N 50/80; H01L 23/5329–53295; H01L 21/76801–76837
See application file for complete search history.

(56) References Cited

U.S. PATENT DOCUMENTS

| | | | | |
|---|---|---|---|---|
| 8,455,965 B2 | 6/2013 | Li | | |
| 9,502,640 B1 | 11/2016 | Annunziata | | |
| 9,559,294 B2 | 1/2017 | Hsu | | |
| 10,651,365 B2 | 5/2020 | Li | | |
| 10,937,945 B2 | 3/2021 | Marchack | | |
| 11,133,457 B2 | 9/2021 | Patlolla | | |
| 2005/0195532 A1* | 9/2005 | Sugiyama | G11C 11/161 | 360/322 |
| 2014/0021566 A1* | 1/2014 | Park | H10N 50/10 | 257/421 |
| 2014/0124881 A1* | 5/2014 | Kwon | G11C 11/161 | 257/421 |

(Continued)

*Primary Examiner* — William B Partridge
*Assistant Examiner* — Alexandre X Ramirez
(74) *Attorney, Agent, or Firm* — Samuel A. Waldbaum

(57) ABSTRACT

A semiconductor device including a magnetic tunnel junction (MTJ) stack, where a tunneling barrier of the MTJ stack is wider than a reference layer of the MTJ stack. A semiconductor device is provided. The semiconductor device including a magnetic tunnel junction (MTJ) stack, where a tunneling barrier of the MTJ stack is wider than a reference layer of the MTJ stack, where the tunneling barrier comprises a center portion and two outer portions, where the center portion is on an upper horizontal portion of the reference layer, and the two outer portions are on a slanted upper surface of an encapsulation layer surrounding the reference layer. Forming a magnetic tunnel junction (MTJ) stack, where a tunneling barrier of the MTJ stack is wider than a reference layer of the MTJ stack.

18 Claims, 16 Drawing Sheets

(56) References Cited

U.S. PATENT DOCUMENTS

| | | | | |
|---|---|---|---|---|
| 2014/0284734 | A1 * | 9/2014 | Kanaya .................. | H10N 50/10<br>257/421 |
| 2019/0221609 | A1 * | 7/2019 | Aggarwal .............. | H10B 61/00 |
| 2020/0395531 | A1 * | 12/2020 | Kwon .................... | H10N 50/80 |
| 2023/0180622 | A1 | 6/2023 | Motoyama | |

* cited by examiner

MRAM DEVICE WITH TUNNEL BARRIER OVERHANG

BACKGROUND

The present invention relates, generally, to the field of semiconductor manufacturing, and more particularly to fabricating a magnetic tunnel junction device with tunnel barrier overhang.

Magneto resistive random-access memory ("MRAM") devices are used as non-volatile computer memory. MRAM data is stored by magnetic storage elements. The elements are formed from two ferromagnetic layers, each of which can hold a magnetic field, separated by a spin conductor layer. One of the two layers is a reference magnet, or a reference layer, set to a particular polarity, while the remaining layer's field can be changed to match that of an external field to store memory and is termed the "free magnet" or "free-layer". This configuration is known as the magnetic tunnel junction (MTJ) and is the simplest structure for a MRAM bit of memory.

SUMMARY

According to an embodiment of the present invention, a semiconductor device is provided. The semiconductor device including a magnetic tunnel junction (MTJ) stack, where a tunneling barrier of the MTJ stack is wider than a reference layer of the MTJ stack.

According to an embodiment of the present invention, a semiconductor device is provided. The semiconductor device including a magnetic tunnel junction (MTJ) stack, where a tunneling barrier of the MTJ stack is wider than a reference layer of the MTJ stack, where the tunneling barrier comprises a center portion and two outer portions, where the center portion is on an upper horizontal portion of the reference layer, and the two outer portions are on a slanted upper surface of an encapsulation layer surrounding the reference layer.

According to an embodiment of the present invention, a method is provided. The method including forming a magnetic tunnel junction (MTJ) stack, where a tunneling barrier of the MTJ stack is wider than a reference layer of the MTJ stack.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
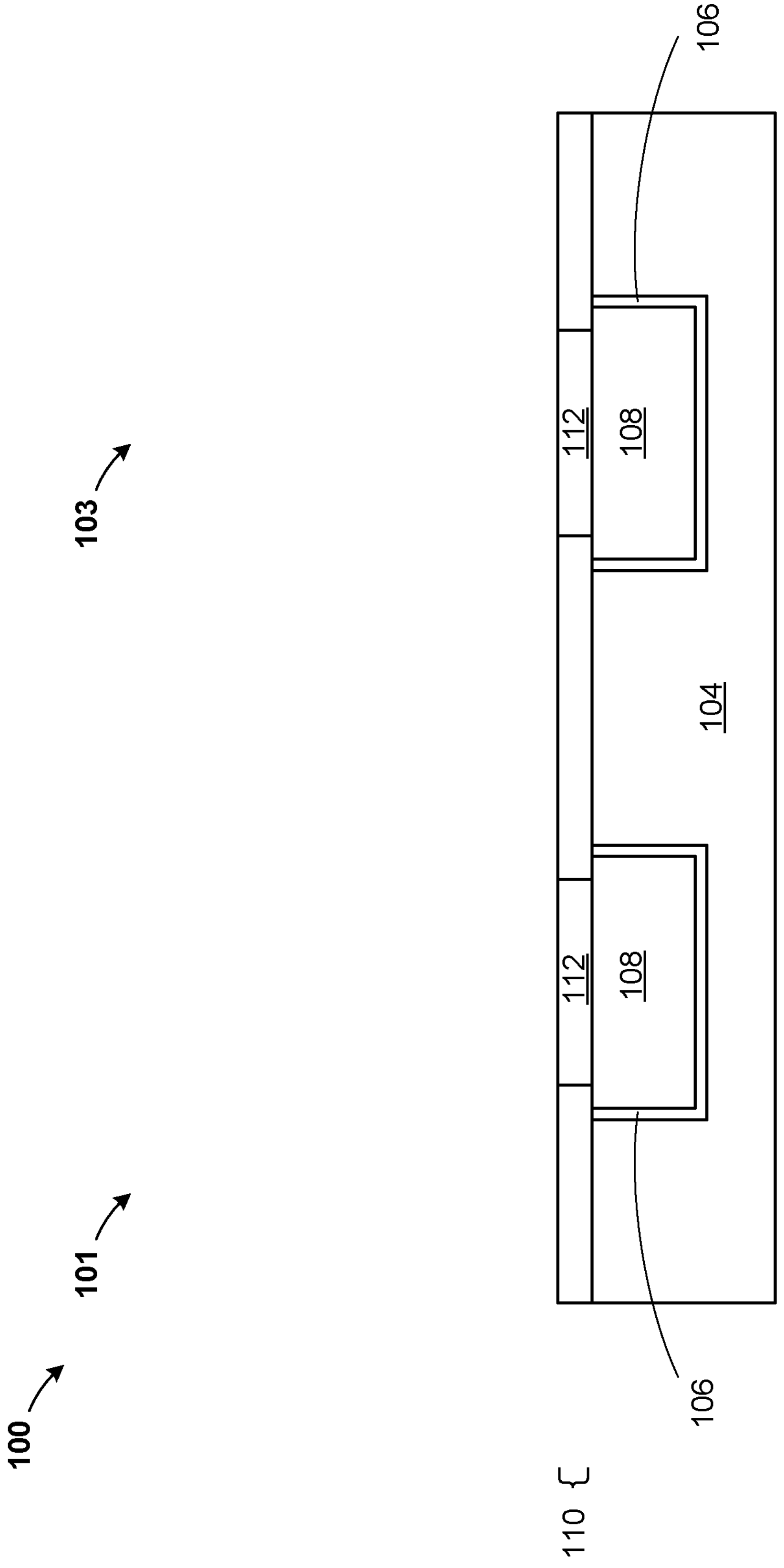
FIG. 1 illustrates a cross-sectional view of a multi-state memory cell, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As stated above, magneto resistive random-access memory (hereinafter "MRAM") devices are a non-volatile computer memory technology. MRAM data is stored by magnetic storage elements. The elements are formed from two ferromagnetic layers, each of which can hold a magnetic field, separated by a spin conductor layer. One of the two layers is a reference magnet, or a reference layer, set to a particular polarity, while the remaining layer's field can be changed to match that of an external field to store memory and is termed the "free magnet" or "free-layer". The magnetic reference layer may be referred to as a reference layer, and the remaining layer may be referred to as a free layer. This configuration is known as the magnetic tunnel junction (hereinafter "MTJ") and is the simplest structure for a MRAM bit of memory.

A memory device is built from a grid of such memory cells or bits. In some configurations of MRAM, such as the type further discussed herein, the magnetization of the magnetic reference layer is fixed in one direction (up or down), and the direction of the magnetic free layer can be switched by external forces, such as an external magnetic field or a spin-transfer torque generating charge current. A smaller current (of either polarity) can be used to read resistance of the device, which depends on relative orientations of the magnetizations of the magnetic free layer and the magnetic reference layer. The resistance is typically higher which the magnetizations are anti-parallel and lower when they are parallel, though this can be reversed, depending on materials used in fabrication of the MRAM.

The MRAM stack layers may be conformally formed using known techniques. In formation of the MTJ stacks layers, the reference layer is formed on a dielectric and a bottom electrode. The tunneling barrier layer is formed on the reference layer. In an embodiment, the tunneling barrier layer is a barrier, such as a thin insulating layer or electric potential, between two electrically conducting materials. Electrons (or quasiparticles) pass through the tunneling barrier layer by the process of quantum tunneling. In certain embodiments, the tunneling barrier layer includes at least one sublayer composed of magnesium oxide (MgO). It should be appreciated that materials other than MgO can be used to form the tunneling barrier layer. The free layer is a magnetic free layer that is adjacent to tunneling barrier layer and opposite the reference layer. The free layer has a magnetic moment or magnetization that can be flipped. It should also be appreciated that the MTJ stack layers may include additional layers, omit certain layers, and each of the layers may include any number of sublayers. Moreover, the composition of layers and/or sublayers may be different between the different MRAM stacks.

For high performance MRAM devices based on perpendicular magnetic tunnel junction (MTJ) structures, well-defined interfaces and interface control are essential. MTJ structures typically include a cobalt (Co) based synthetic anti-ferromagnet (SAF), a CoFeB-based reference layer, a MgO-based tunnel barrier, a CoFeB-based free layer, and cap layers containing e.g. tantalum (Ta) and/or ruthenium (Ru). Embedded MTJ structures are usually formed by subtractive patterning of blanket MTJ stacks into pillars between two metal levels.

After MTJ stack patterning, the inter-pillar spaces are filled with an inter-layer dielectric (ILD) to enable connection to BEOL wiring by a top contact level. The subtractive patterning has a risk of shorts due to metal re-sputtering from the bottom electrode and from the top electrode. ILD gap fill between pillars or adjacent MTJ stacks presents a significant challenge since the presence of voids in the ILD between the pillars can lead to shorts. The voids may then become filled with metal re-sputtered material. The filled voids may cause shorts between adjacent top contacts of adjacent MTJ stacks. There is a need for embedded MTJ structures formed with a reduced risk of ILD void induced shorts.

In this invention, after each layer of MTJ stack patterning, inter-pillar spaces are filled with inter-layer dielectric (hereinafter "ILD") to enable connection to back end of line ("BEOL") layers wiring by a top contact level without voids in the ILD.

The present invention relates to fabricating a MTJ device with a tunnel barrier overhang. The tunnel barrier and the free layer each include three connected segments or portions, including a straight inner segment and two curved outer segments surrounding the straight inner segment. The tunnel barrier and the free layer are each wider than the reference layer. An encapsulation layer surrounding the reference layer has a curved or tapered top surface. The tunnel barrier covers an upper horizontal surface of the reference layer and extends beyond the reference layer, also covering the upper horizontal surface of the curved encapsulation layer. The free layer covers an upper horizontal surface of the tunnel barrier, following the same curve as the curved encapsulation layer.

The tunnel barrier and the free layer are wider than the reference layer and prevent metal re-sputtering from the bottom electrode. The bottom electrode is protected by an ILD surrounding the bottom electrode, by the encapsulation layer surrounding the reference layer, a second ILD surrounding the encapsulation layer surrounding the reference layer, and by the overhang of the tunnel barrier and the free layer.

A second encapsulation layer surrounds a vertical side surface of both the tunneling barrier and the free layer. A third ILD surrounds the tunneling barrier, the free layer and the second encapsulation layer surrounding the vertical side surface of both the tunneling barrier and the free layer. The second encapsulation layer and the third ILD protected the MTJ stack during the formation of a top electrode.

The overhang of the tunnel barrier and the free layer helps to reduce ILD voiding between adjacent MTJ stacks. This helps to extend scalability of MRAM device memory elements due to void-free gap fill between MRAM pillars and improved embedded MRAM performance due to reduced top contact shorts.

Forming individual ILD layers surrounding each of the bottom electrode; the first encapsulation layer surrounding the reference layer; the second encapsulation layer, the tunneling barrier and the free layer; and the top electrode helps to reduce gaps in the ILD surrounding the devices as three separately formed ILDs, each for a lower height than forming a single ILD, surround an entire vertical side surface of the MTJ device.

Referring now to FIG. 1, a semiconductor structure 100 (hereinafter "structure") at an intermediate stage of fabrication is shown according to an exemplary embodiment. FIG. 1 is a cross-sectional view of the structure 100. The structure 100 may be formed or provided. The structure 100 may include a cell 101 and a cell 103. The cells 101, 103, each includes, for example, an inter-layer dielectric (hereinafter "ILD") 104, a liner 106, a lower metal wire 108, an inter-layer dielectric (hereinafter "ILD") 110, and a metal cap 112.

The structure 100 may include several back end of line ("BEOL") layers. In general, the back end of line (BEOL) is the second portion of integrated circuit fabrication where the individual devices (transistors, capacitors, resistors, etc.) are interconnected with wiring on the wafer.

The ILD 104 may be formed by depositing or growing a dielectric material on the BEOL layers, followed by a chemical mechanical polishing (CMP) or etch steps. The ILD 104 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by a planarization process, such as CMP, or any suitable etch process. In an embodiment, the ILD 104 may include one or more layers. In an embodiment, the ILD 104 may include any dielectric material such as silicon oxide (SiOx), silicon nitride (SiNx), silicon boron carbonitride (SiBCN), NBLoK, a low-k dielectric material (with k<4.0), including but not limited to, silicon oxide, spin-on-glass, a flowable oxide, a high-density plasma oxide, borophosphosilicate glass (BPSG), or any combination thereof or any other suitable dielectric material.

The lower metal wire 108 may be formed by first patterning two or more trenches (not shown) into the ILD 104, lining the two or more trenches with the liner 106, and filling the two or more trenches.

The liner 106 separates the conductive interconnect material of the lower metal wire 108 from the ILD 104. The liner 106 may be composed of, for example, tantalum nitride (TaN), tantalum (Ta), titanium (Ti), titanium nitride (TiN), or a combination thereof. The liner 106 may be deposited utilizing a conventional deposition process such as, for example, CVD, plasma enhanced chemical vapor deposition (PECVD), PVD or ALD. The liner 106 may be 5 nm thick, although a thickness less than or greater than 5 nm may be acceptable. The liner 106 surrounds a lower horizontal surface and a vertical side surface of the lower metal wire 108.

In an embodiment, the lower metal wire 108 is formed from a conductive material layer which is blanket deposited on top of the structure 100, and directly on a top surface of the liner 106, filling the two or more trenches (not shown). The conductive material layer may include materials such as, for example copper (Cu), ruthenium (Ru), cobalt (Co), tungsten (W). The conductive material can be formed by for example, chemical vapor deposition (CVD), physical vapor deposition (PVD), and atomic layer deposition (ALD) or a combination thereof. The lower metal wire 108 is formed by damascene, or patterned from the conductive material layer, using known patterning and etching techniques. There may be any number of openings in the ILD 104, each filled with the liner 106 and the lower metal wire 108, on the structure 100.

A planarization process, such as, for example, chemical mechanical polishing (CMP), may be done to remove excess material from a top surface of the structure 100 such that upper horizontal surfaces of the lower metal wire 108, the liner 106 and the ILD 104 are coplanar.

In an embodiment, the lower metal wire 108 may have a thickness ranging from about 10 nm to about 100 nm, although a thickness less than 10 nm and greater than 100 nm may be acceptable.

The ILD 110 may be formed as described for the ILD 104, directly on a top surface of the liner 106, the lower metal wire 108 and the ILD 104. The metal cap 112 may be formed by first patterning two or more second trenches (not shown) into the ILD 110 vertically aligned above the lower metal wire 108 and the liner 106, and filling the two or more second trenches. The ILD 110 is unlikely to contain voids as the ILD 110 is blanket deposited on the planarized upper surface of the lower metal wire 108 and the liner 106.

In an embodiment, the metal cap 112 is formed from a conductive material layer which is blanket deposited on top of the structure 100, and directly on a top surface of the ILD 110, the liner 106, the lower metal wire 108 and the ILD 104. The conductive material layer may include materials such as, for example tantalum (Ta), ruthenium (Ru), titanium (Ti), tungsten (W). The conductive material can be formed by for example, chemical vapor deposition (CVD), physical vapor deposition (PVD), and atomic layer deposition (ALD) or a combination thereof. The metal cap 112 is formed by damascene, or patterned from the conductive material layer, using known patterning and etching techniques. Damascene is the method of BEOL interconnect formation. A dielectric is deposited, patterned, and the resulting feature is metallized. Any metal overburden is removed by planarization.

A planarization process, such as, for example, chemical mechanical polishing (CMP), may be done to remove excess material from a top surface of the structure 100 such that upper horizontal surfaces of the metal cap 112 and the ILD 110 are coplanar.

Figure 2:
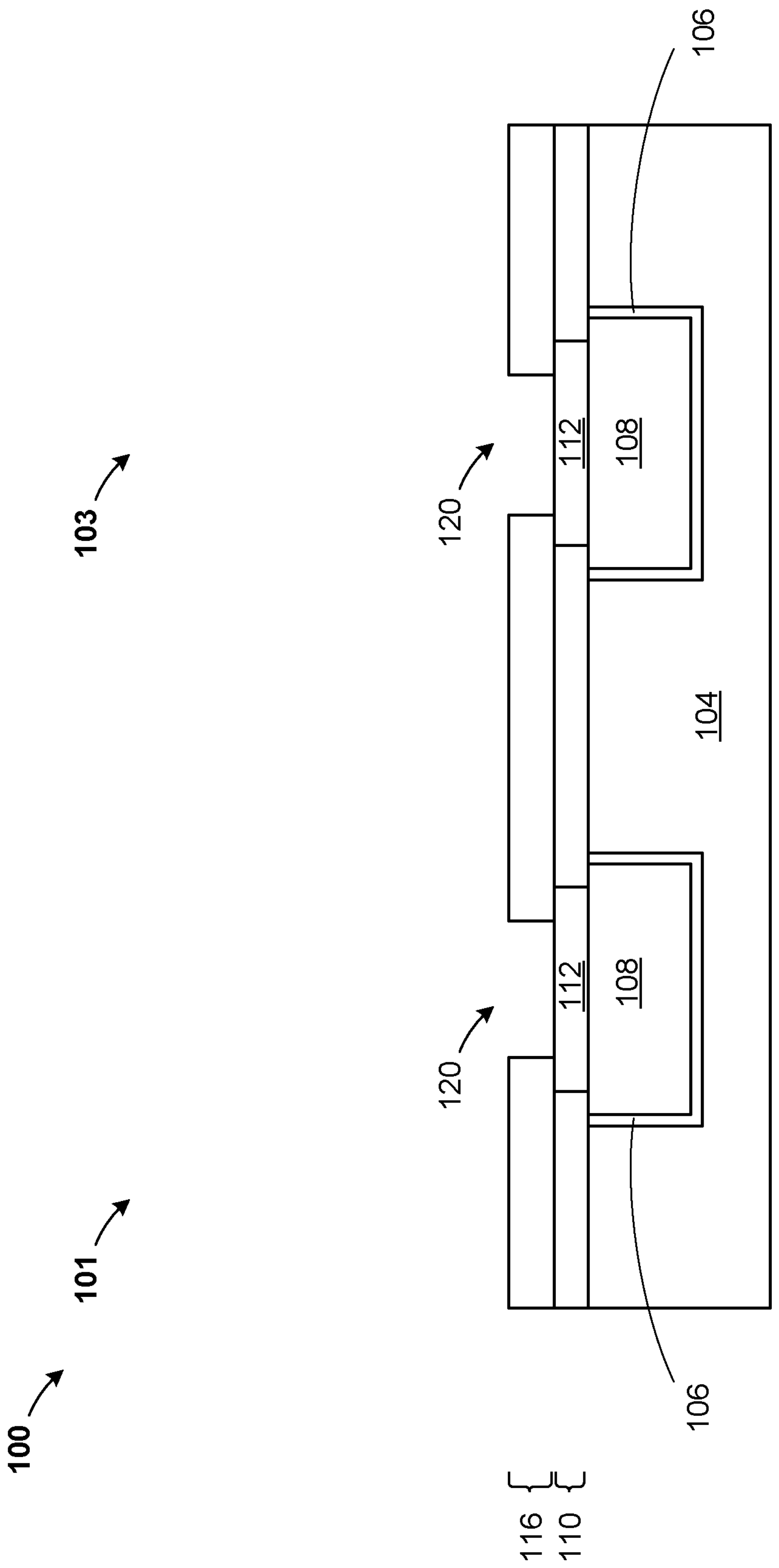
FIG. 2 illustrates a cross-sectional view of the multi-state memory cell and illustrates formation of an inter-layer dielectric and patterning of the inter-layer dielectric, according to an exemplary embodiment.

Referring now to FIG. 2, a cross-sectional view of the structure 100 is shown, according to an embodiment. An inter-layer dielectric (hereinafter "ILD") 116 may be formed.

The ILD 116 may be formed as described for the ILD 104, directly on upper horizontal surfaces of the metal cap 112 and the ILD 110. The ILD 116 is unlikely to contain voids as the ILD 116 is blanket deposited on the planarized upper surface of the metal cap 112 and the ILD 110.

A hard mask (not shown) may formed on the structure 100 and patterned, directly on an upper horizontal surface of the ILD 116. The hard mask (not shown) may be patterned such that portions are removed, forming an opening (not shown). The opening (not shown) may be vertical aligned above the metal cap 112 and the lower metal wire 108, in each of the cells 101, 103. Portions of the ILD 116 may be removed exposing an upper surface of the metal cap 112. The portions of the ILD 116 may be selectively removed using an anisotropic etching technique, such as, for example, reactive ion etching, forming the openings 120. The opening 120 may be vertical aligned above the metal cap 112 and the lower metal wire 108, in each of the cells 101, 103. The hard mask (not shown) may be removed using known techniques.

Figure 3:
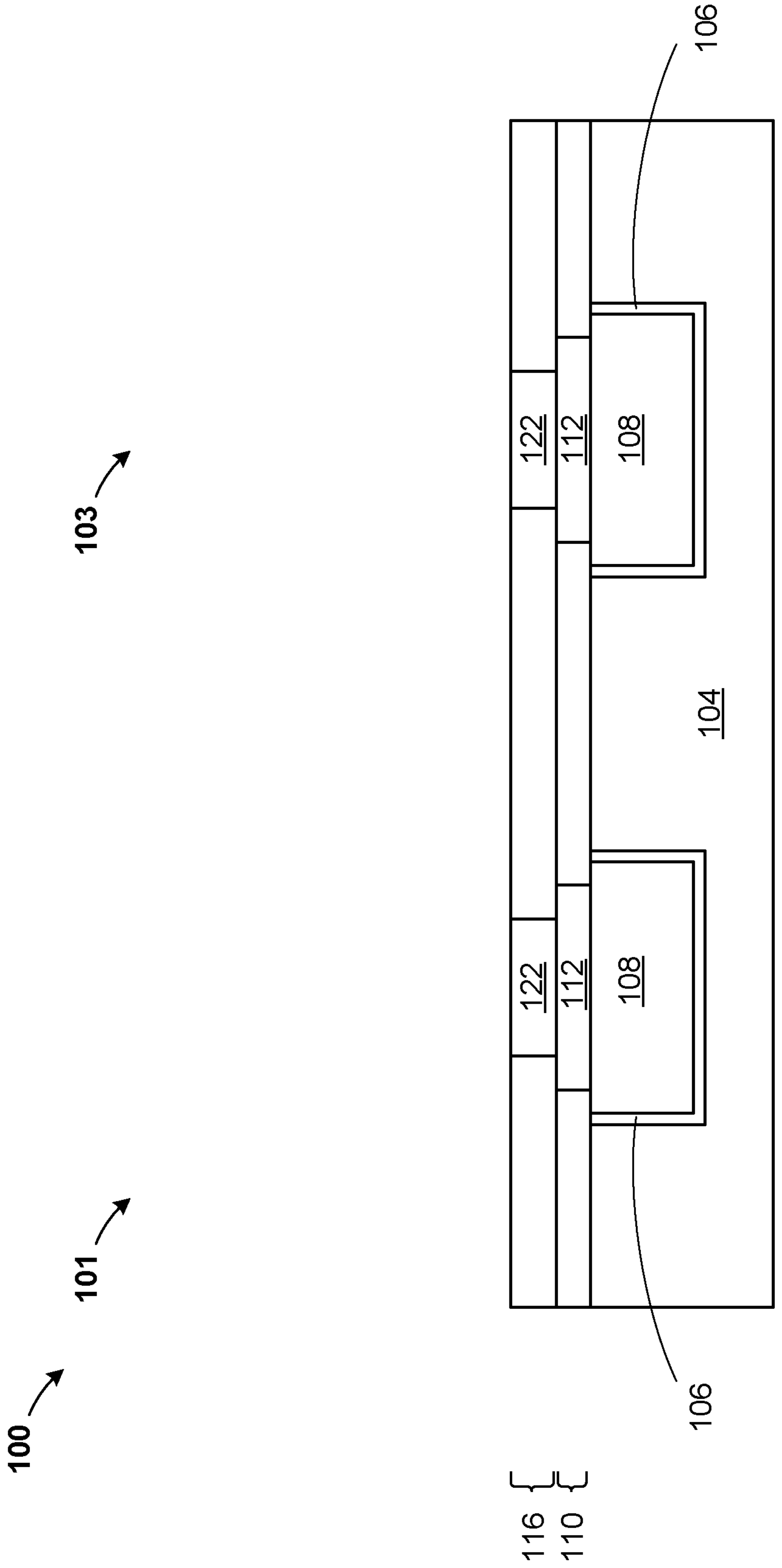
FIG. 3 illustrates a cross-sectional view of the multi-state memory cell and illustrates formation of a bottom electrode, according to an exemplary embodiment.

Referring now to FIG. 3, a cross-sectional view of the structure 100 is shown, according to an embodiment. A bottom electrode 122 may be formed.

In an embodiment, the bottom electrode 122 is formed from a conductive material layer which is blanket deposited on top of the structure 100, and directly on a top surface of the metal cap 112 and the ILD 116, filling the opening 120. The conductive material layer may include materials such as, for example, tantalum nitride (TaN), tantalum (Ta), titanium (Ti), titanium nitride (TiN). The conductive material layer may be deposited using typical deposition techniques, for example, physical vapor deposition, atomic layer deposition, molecular layer deposition, and chemical vapor deposition. A planarization process, such as, for example, chemical mechanical polishing (CMP), may be done to remove excess material from a top surface of the structure 100 such that upper horizontal surfaces of the bottom electrode 122 and the ILD 116 are coplanar. In an embodiment, the bottom electrode 122 may have a thickness ranging from about 10 nm to about 100 nm, although a thickness less than 10 nm and greater than 100 nm may be acceptable.

Figure 4:
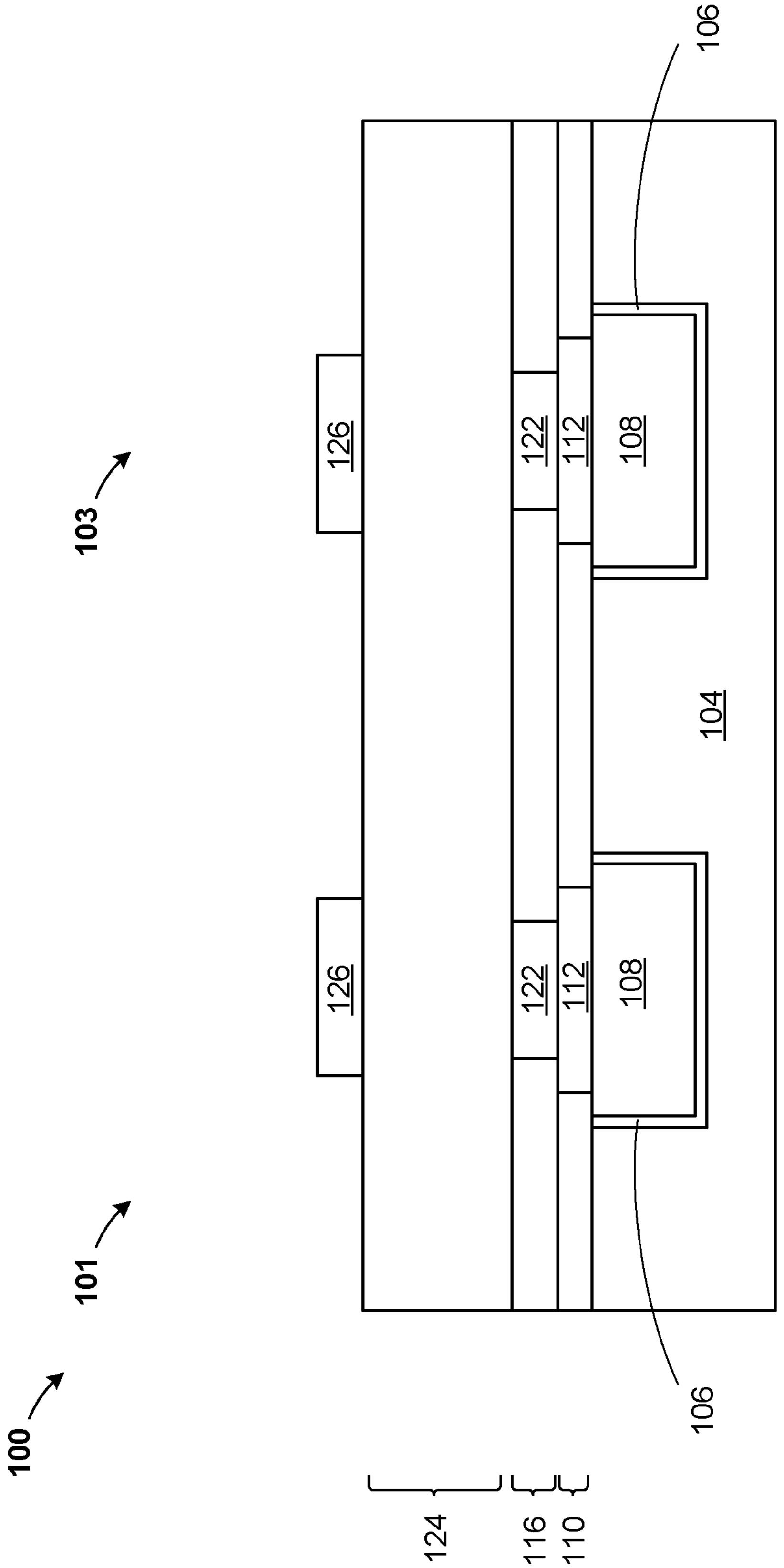
FIG. 4 illustrates a cross-sectional view of the multi-state memory cell and illustrates formation of a reference layer and a hard mask, according to an exemplary embodiment.

Referring now to FIG. 4, a cross-sectional view of the structure 100 is shown, according to an embodiment. A reference layer 124 may be formed. A hard mask 126 may be formed.

The reference layer 124 may be formed conformally on the structure 100. The reference layer 124 may cover an upper horizontal surface of the ILD 116 and an upper horizontal surface of the bottom electrode 122.

The hard mask 126 may formed on the structure 100 and patterned, directly on an upper horizontal surface of the reference layer 124. The hard mask 126 may be patterned such that portions of the hard mask 126 are removed, and remaining portions of the hard mask 126 are vertically aligned above the bottom electrode 122, the metal cap 112 and the lower metal wire 108, in both of the cells 101, 103.

Figure 5:
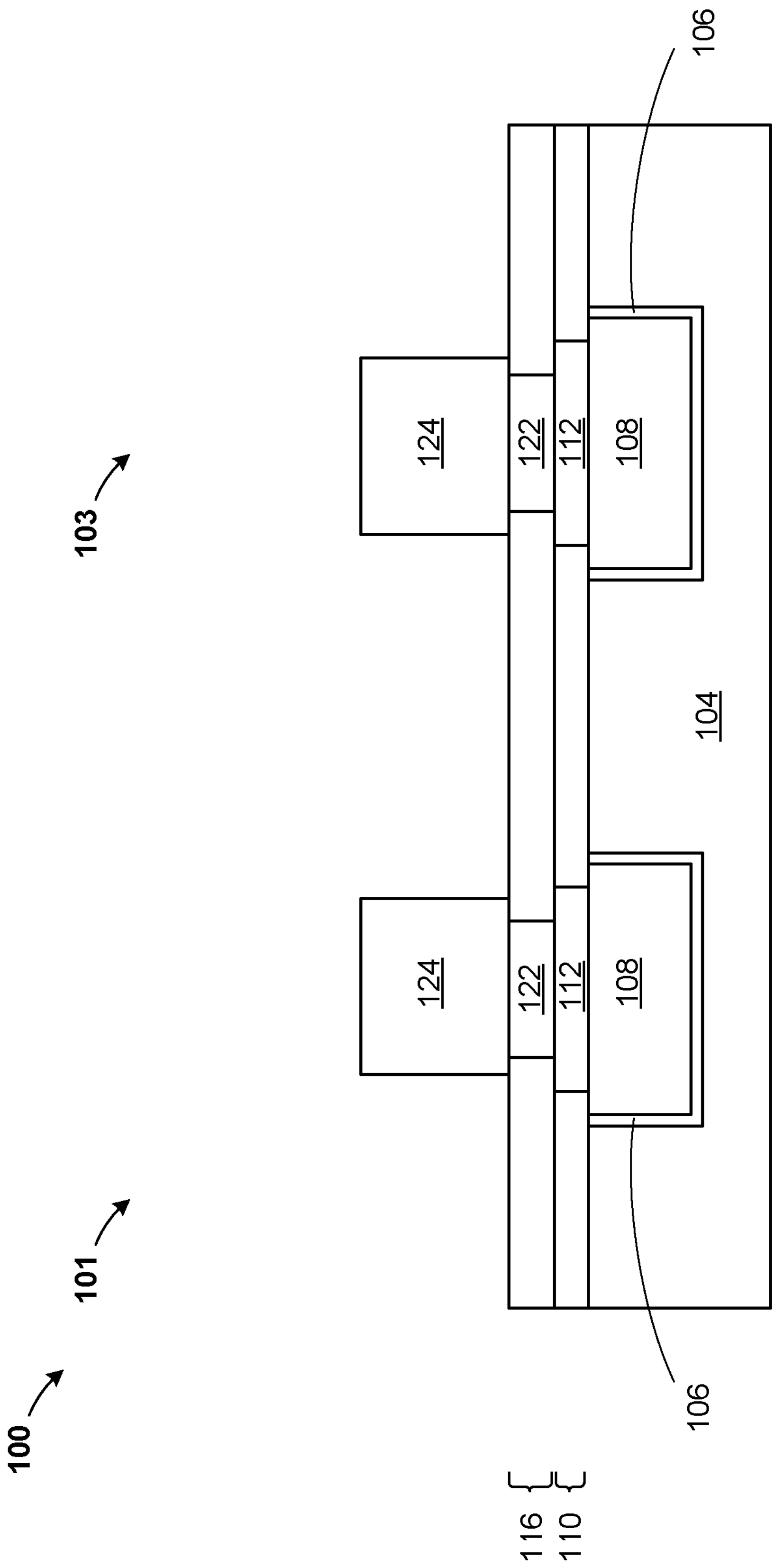
FIG. 5 illustrates a cross-sectional view of the multi-state memory cell and illustrates patterning of the reference layer and removal of the hard mask, according to an exemplary embodiment.

Referring now to FIG. 5, a cross-sectional view of the structure 100 is shown, according to an embodiment. Portions of the reference layer 124 may be removed. The hard mask 126 may be removed.

Portions of the reference layer 124 may be removed selective to the hard mask 126. The portions of the reference layer 124 may be selectively removed using an anisotropic etching technique, such as, for example, reactive ion etching. The remaining portions of the reference layer 124 may remain vertically aligned above the bottom electrode 122, the metal cap 112 and the lower metal wire 108, in both the cells 101, 103, and perpendicular to an upper surface of the lower metal wire 108. The hard mask 126 may be removed using known techniques.

Figure 6:
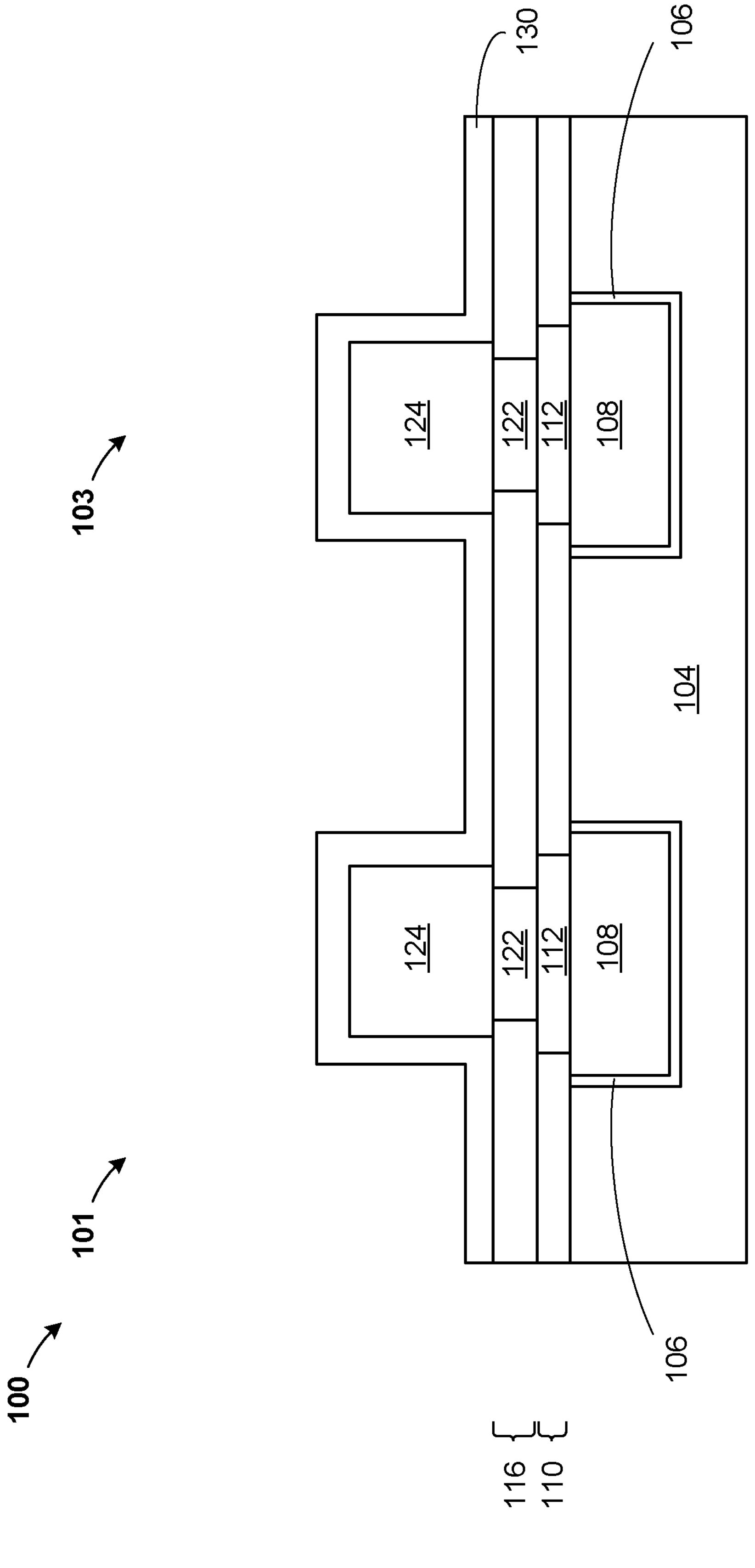
FIG. 6 illustrates a cross-sectional view of the multi-state memory cell and illustrates formation of a first encapsulation layer, according to an exemplary embodiment.

Referring now to FIG. 6, a cross-sectional view of the structure 100 is shown, according to an embodiment. A first encapsulation layer 130 may be formed.

The first encapsulation layer 130 may be conformally formed on the structure 100, on an upper horizontal surface of the ILD 116, and on an upper horizontal surface and vertical side surfaces of the reference layer 124. The first encapsulation layer 130 may include materials such as, for example, any dielectric material such as silicon nitride (SiN) and silicon nitride carbon (SiNC) and may include a single layer or may include multiple layers of dielectric material. In an alternate embodiment, the first encapsulation layer 130 may include zirconium oxide ($ZrO_2$). The first encapsulation layer 130 may be deposited using typical deposition techniques, for example, physical vapor deposition, atomic layer deposition, molecular layer deposition, and chemical vapor deposition. The first encapsulation layer 130 may have a thickness between 3 nm and 30 nm, although thickness greater than 30 nm or less than 3 nm are acceptable.

The first encapsulation layer 130 helps to protect the reference layer 124 from being damaged or oxidized during subsequent processing.

Figure 7:
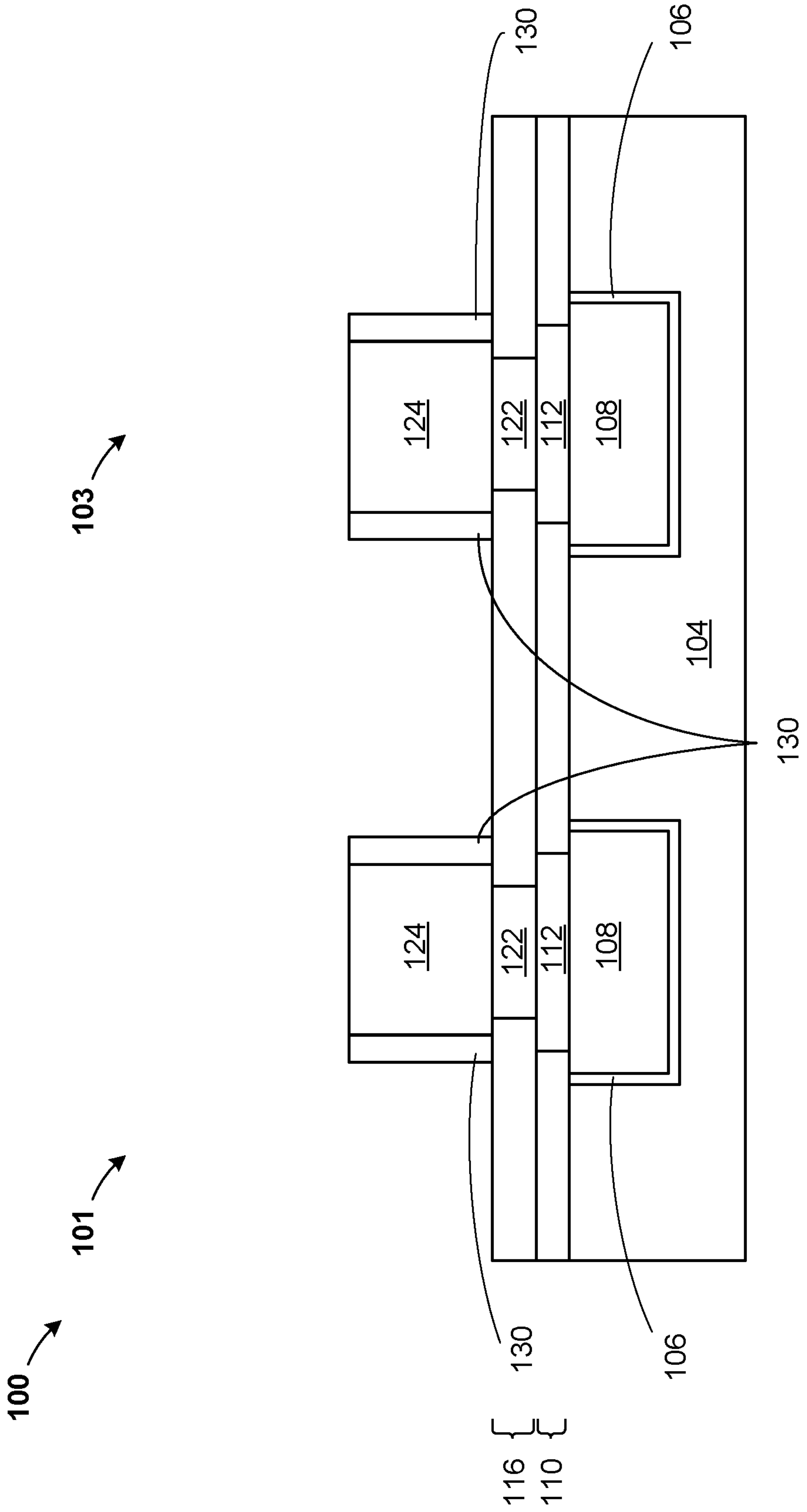
FIG. 7 illustrates a cross-sectional view of the multi-state memory cell and illustrates removal of portions of the first encapsulation layer, according to an exemplary embodiment.

Referring now to FIG. 7, a cross-sectional view of the structure 100 is shown, according to an embodiment. Portions of the first encapsulation layer 130 may be removed.

The portions of the first encapsulation layer 130 may be selectively removed using an anisotropic etching technique, such as, for example, reactive ion etching. The remaining portions of the first encapsulation layer 130 may remain vertically aligned directly adjacent to the reference layer 124, in both the cells 101, 103. The first encapsulation layer 130 may be removed from upper horizontal surfaces of the reference layer 124 and the ILD 116.

Figure 8:
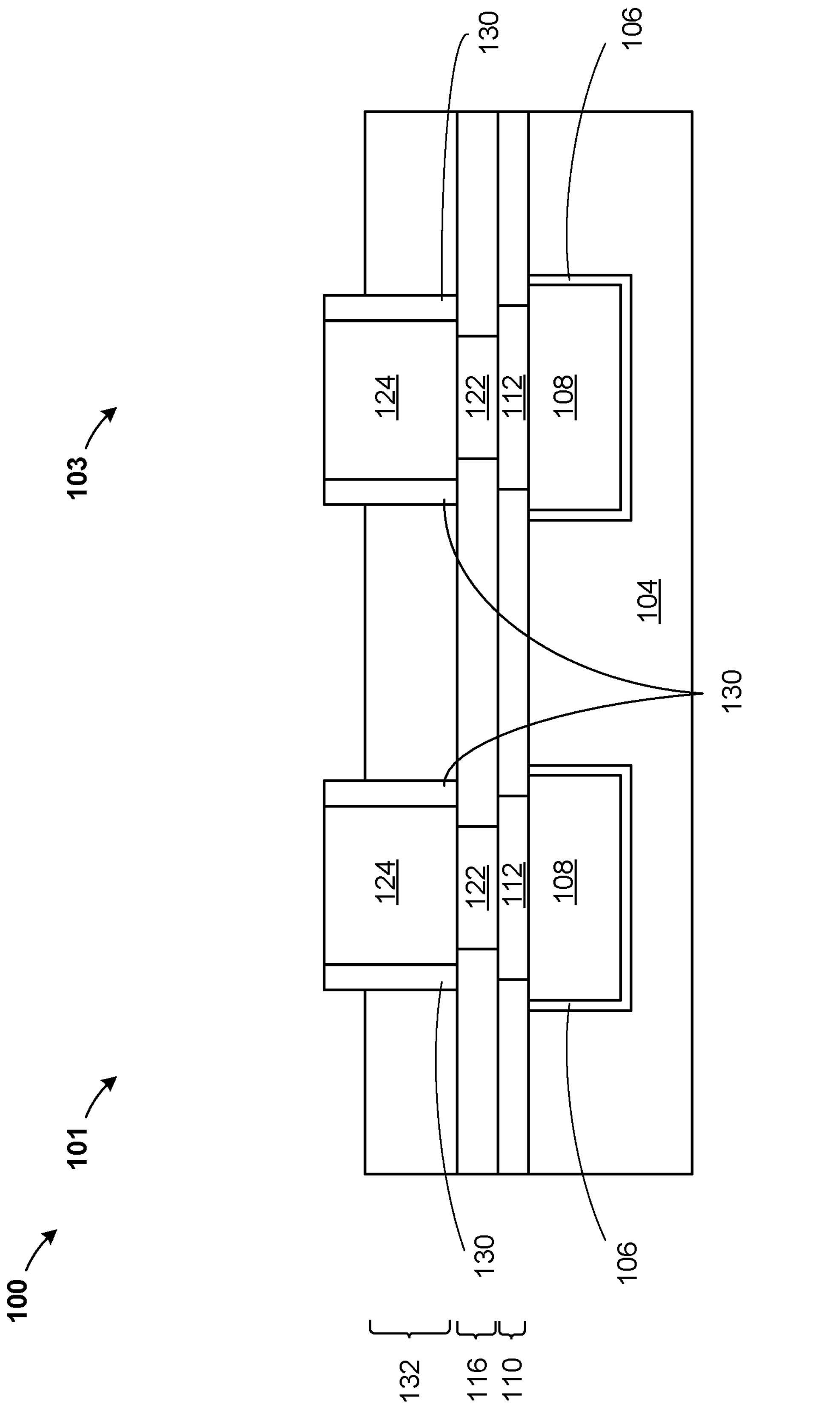
FIG. 8 illustrates a cross-sectional view of the multi-state memory cell and illustrates formation of a second inter-layer dielectric, according to an exemplary embodiment.

Referring now to FIG. 8, a cross-sectional view of the structure 100 is shown, according to an embodiment. An inter-layer dielectric (hereinafter "ILD") 132 may be formed.

The ILD 132 may be formed as described for the ILD 104, conformally on the structure 100, covering upper horizontal surfaces of the first encapsulation layer 130, the reference layer 124 and the ILD 116 and vertical side surfaces of the first encapsulation layer 130. The ILD 132 is unlikely to contain voids as the ILD 132 is blanket deposited on the structure 100 and fills openings between adjacent reference layers 124 and the first encapsulation layer 130 between cells 101, 103. This is less likely to contain voids than forming an inter-layer dielectric surrounding multiple layers of the cell 101, 103.

A planarization process, such as, for example, chemical mechanical polishing (CMP), may be done to remove excess material from a top surface of the structure 100 such that upper horizontal surfaces of the ILD 132, the reference layer 124 and the first encapsulation layer 130 are coplanar.

Portions of the ILD 132 may be selectively removed or recessed using an anisotropic etching technique, such as, for example, reactive ion etching, exposing a portion of a vertical side surface of the first encapsulation layer 130. The remaining portions of the first ILD 132 may remain adjacent to a remaining portion of the vertical side surface of the reference layer 124, in both the cells 101, 103.

Figure 9:
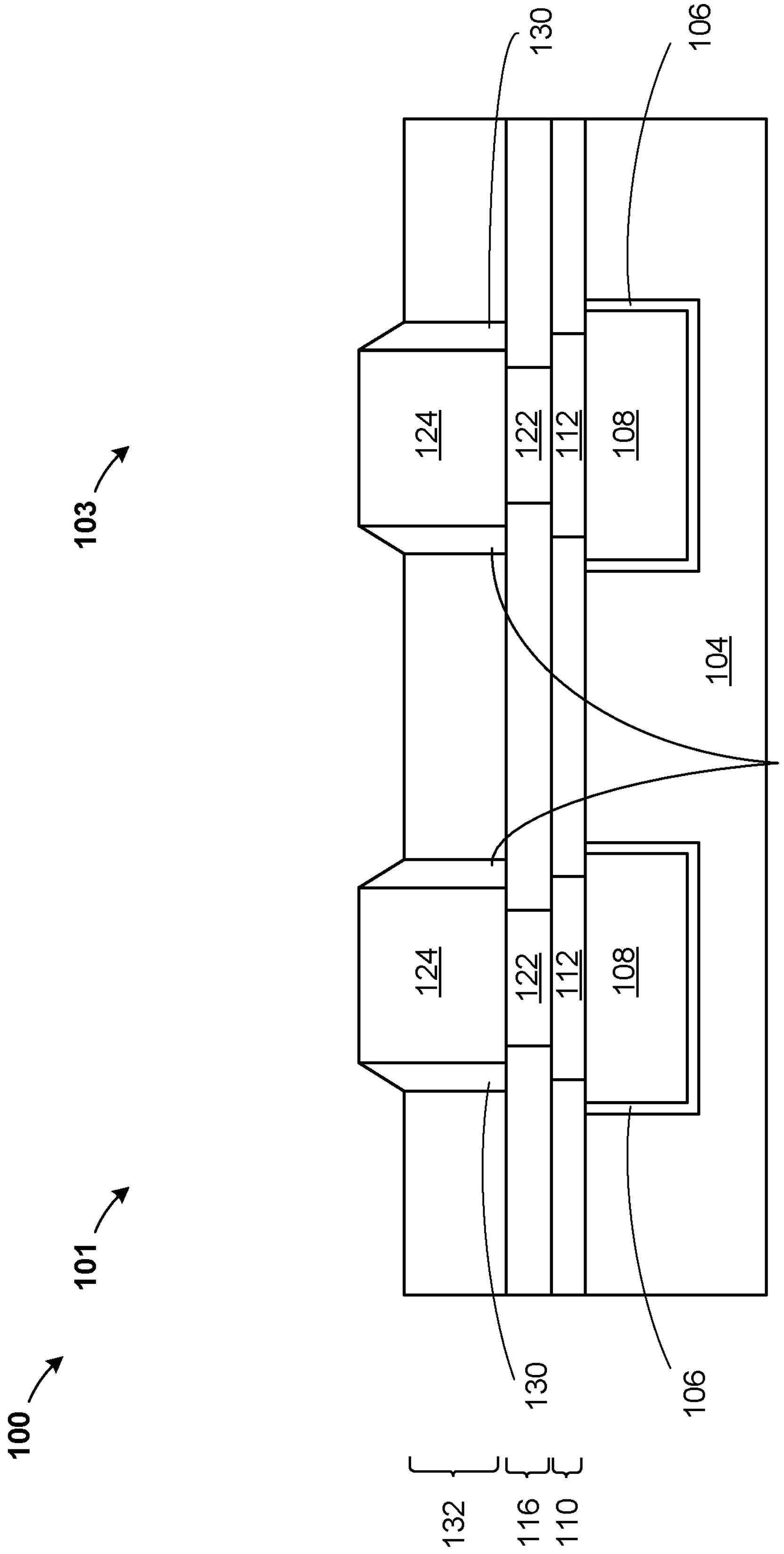
FIG. 9 illustrates a cross-sectional view of the multi-state memory cell and illustrates removal of additional portions of the first encapsulation layer, according to an exemplary embodiment.

Referring now to FIG. 9, a cross-sectional view of the structure 100 is shown, according to an embodiment. Additional portions of the first encapsulation layer 130 may be removed.

The additional portions of the first encapsulation layer 130 may be removed from an upper surface of the first encapsulation layer 130, forming a tapered or curved or slanted upper surface of the first encapsulation layer 130. The ILD 132 is protecting a lower portion of the first encapsulation layer 130. The additional portions of the first encapsulation layer 130 may be selectively removed using an anisotropic etching technique, such as, for example, reactive ion etching. The portions of the first encapsulation layer 130 may be etched such that the first encapsulation layer 130 may have a tapered upper surface, with a width of the first encapsulation layer 130 more narrow at an upper horizontal surface closer to an upper horizontal surface of the reference layer 124 and a width wider at a lower horizontal surface of the reference layer 124.

Figure 10:
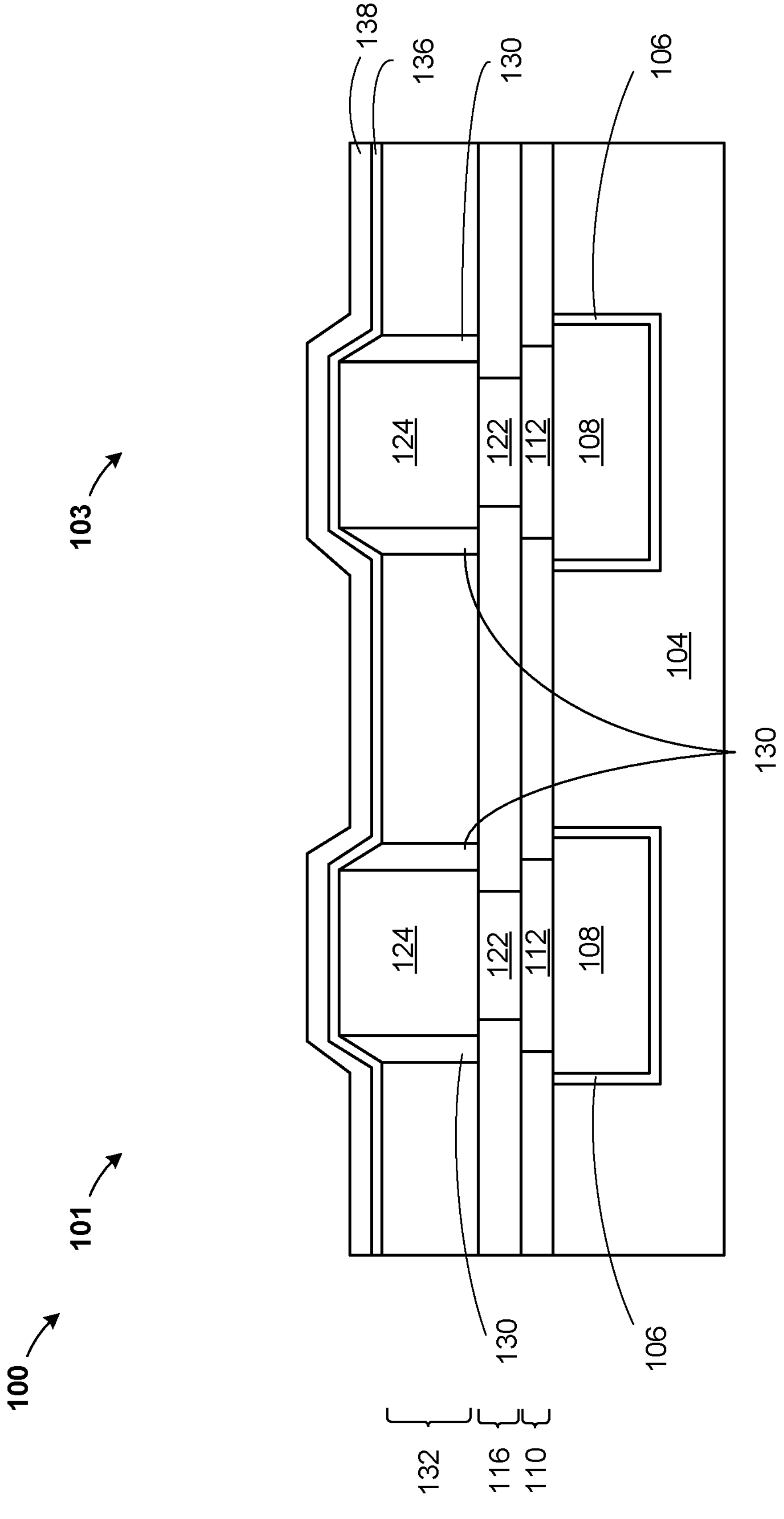
FIG. 10 illustrates a cross-sectional view of the multi-state memory cell and illustrates formation of a tunneling barrier and a free layer, according to an exemplary embodiment.

Referring now to FIG. 10, a cross-sectional view of the structure 100 is shown, according to an embodiment. A tunneling barrier 136 may be formed. A free layer 138 may be formed.

The tunneling barrier 136 may be formed conformally on the structure 100, on upper horizontal surfaces of the ILD 132, on upper horizontal surfaces of the reference layer 124 and on the tapered upper surface of first encapsulation layer 130.

The free layer 138 may be formed conformally on the structure 100, on upper horizontal surfaces of the tunneling barrier 136, including on the tapered upper surfaces of the tunneling barrier 136 over the first encapsulation layer 130.

Figure 11:
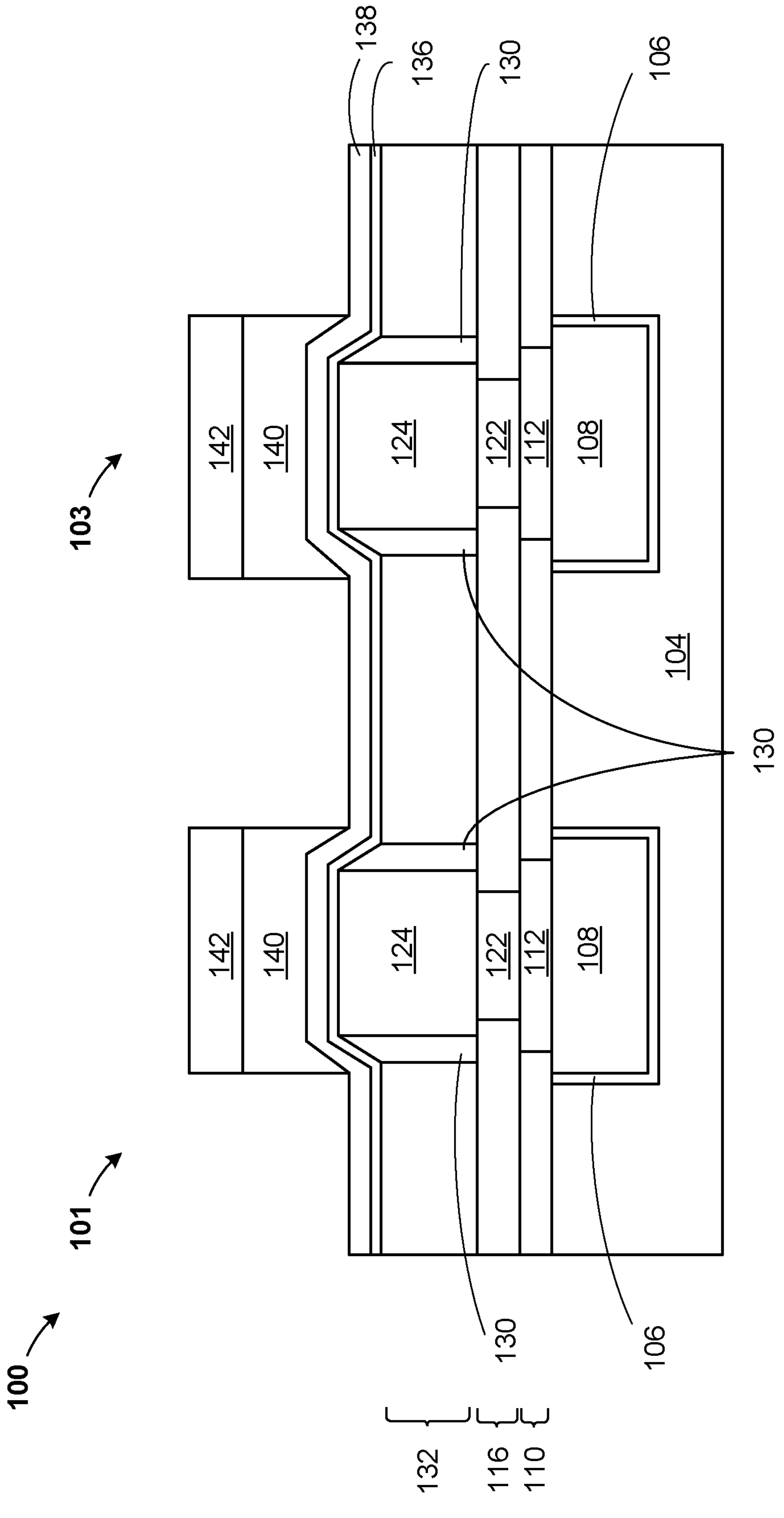
FIG. 11 illustrates a cross-sectional view of the multi-state memory cell and illustrates formation of an organic planarization layer and a hard mask, and patterning the organic planarization layer and the hard mask, according to an exemplary embodiment.

Referring now to FIG. 11, a cross-sectional view of the structure 100 is shown, according to an embodiment. An organic planarization layer (hereinafter "OPL") 140 and a hard mask 142 may be formed.

A lithography soft mask, such as the OPL 140 may be used for the patterning process. The OPL 140 may be formed by a blanket deposition using typical deposition techniques, for example spin-on coating. The OPL 140 can be a self-planarizing organic material that includes carbon, hydrogen, oxygen, and optionally nitrogen, fluorine, and silicon. The OPL 140 can be a standard $C_xH_y$ polymer. Non-limiting examples of materials include, but are not limited to, CHM701B, commercially available from Cheil Chemical Co., Ltd., HM8006 and HM8014, commercially available from JSR Corporation, and ODL-102 or ODL-401, commercially available from ShinEtsu Chemical, Co., Ltd.

The hard mask 142 may be formed on the structure 100 and patterned, directly on an upper horizontal surface of the OPL 140. The hard mask 142 may be patterned such that remaining portions of the hard mask 142 are vertically aligned above the reference layer 124, the bottom electrode 122, the metal cap 112 and the lower metal wire 108, in both the cells 101, 103.

A lithograph patterning and dry etch technique may be used to selectively remove a portion of the OPL 140, selective to the remaining portions of the hard mask 142. Remaining portions of the OPL 140 are vertically aligned above the reference layer 124, the bottom electrode 122, the metal cap 112 and the lower metal wire 108, in both the cells 101, 103.

Figure 12:
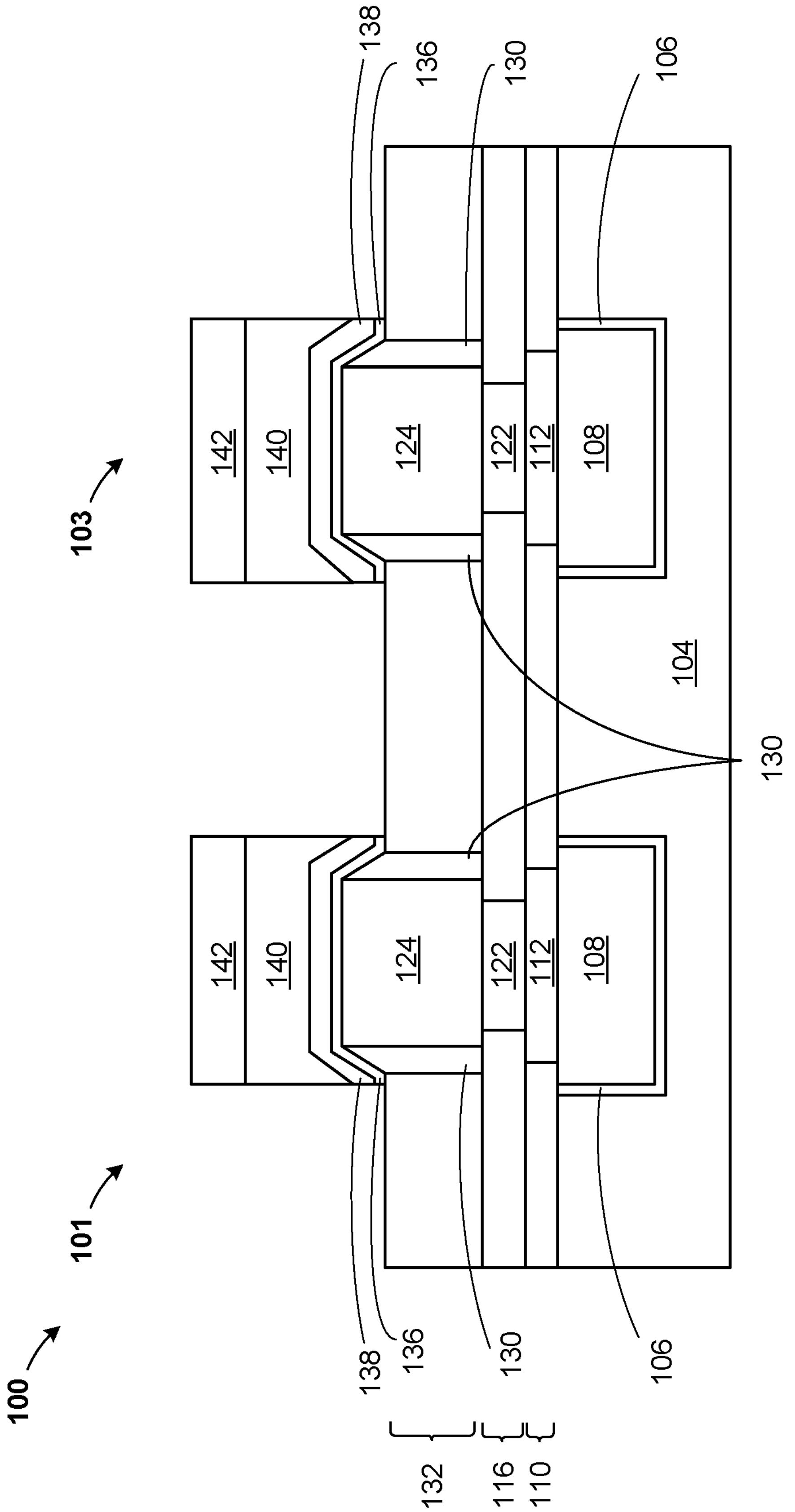
FIG. 12 illustrates a cross-sectional view of the multi-state memory cell and illustrates patterning of the tunneling barrier and the free layer, according to an exemplary embodiment.

Referring now to FIG. 12, a cross-sectional view of the structure 100 is shown, according to an embodiment. Portions of the free layer 138 and portions of the tunneling barrier 136 may be removed.

The portions of the free layer 138 and the portions of the tunneling barrier 136 are removed selective to the hard mask 142 and the OPL 140. Remaining portions of the free layer 138 and the tunneling barrier 136 may have a continuous area with different surfaces which follow a contour of the sloped upper surface of the first encapsulation layer 130, an upper surface of the reference layer 124, and another sloped upper surface of the first encapsulation layer 130. The free layer 138 and the tunneling barrier 136 may have a consistent thickness across the continuous area, when measured from an upper horizontal surface of the ILD 104. A portion of an upper horizontal surface of the free layer 138 may be below a lower horizontal surface of the free layer 138, when measured from an upper horizontal surface of the ILD 104. A portion of an upper horizontal surface of the tunneling barrier 136 may be below a lower horizontal surface of the tunneling barrier 136, when measured from an upper horizontal surface of the ILD 104.

The portions of the free layer 138 and the tunneling barrier 136 which follow the contour of the sloped side surface of the first encapsulation layer 130, may be referred to as an overhang.

The tunneling barrier 136 and the free layer 138 each include three connected segments, including a straight inner segment and two curved outer segments surrounding the straight inner segment. The tunneling barrier 136 and the free layer 138 are each wider than the reference layer 124. The first encapsulation layer 130 surrounding the reference layer 124 has a curved or tapered or slanted top surface. The tunneling barrier 136 covers an upper horizontal surface of the reference layer 124 and extends beyond the reference layer 124, also covering the upper horizontal surface of the curved first encapsulation layer 130. The free layer 138 covers an upper horizontal surface of the tunneling barrier 136, following the same curve as the curved first encapsulation layer 130.

A lowermost portion of the tunneling barrier 136 is below a topmost portion of the reference layer 124. A lowermost portion of the of the free layer 138 is below a topmost portion of the reference layer 124.

Figure 13:
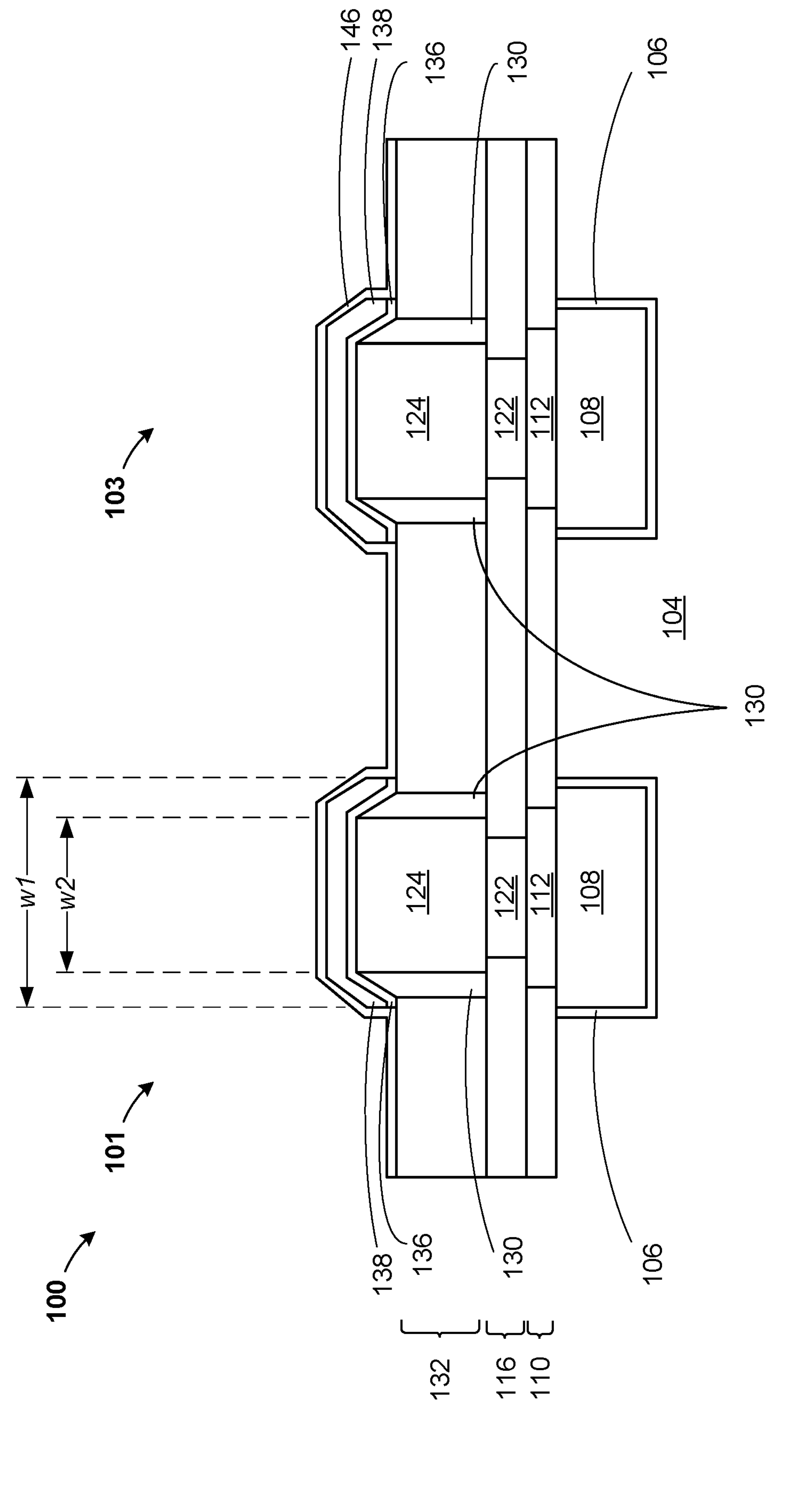
FIG. 13 illustrates a cross-sectional view of the multi-state memory cell and illustrates removal of both the organic planarization layer and the hard mask, and formation of a second encapsulation layer, according to an exemplary embodiment.

Referring now to FIG. 13, a cross-sectional view of the structure 100 is shown, according to an embodiment. A second encapsulation layer 146 may be formed.

The second encapsulation layer 146 may be conformally formed on the structure 100, on an upper horizontal surface of the ILD 132, and on an upper horizontal surface and vertical side surfaces of the free layer 138, and on vertical side surfaces of the tunneling barrier 136. The second encapsulation layer 146 may be formed as described for the first encapsulation layer 130.

The second encapsulation layer 146 helps to protect the free layer 138 and the tunneling barrier 136 from being damaged or oxidized during subsequent processing.

The tunneling barrier 136 and the free layer 138, have a width, w1, which is wider than a width, w2, of the reference layer 124, which prevents metal re-sputtering from the bottom electrode 122. The bottom electrode 122 is protected by the ILD 116 surrounding the bottom electrode 122, by the first encapsulation layer 130 surrounding the reference layer 124, the ILD 132 surrounding the first encapsulation layer 130 surrounding the reference layer 124, and by the overhang of the tunneling barrier 136 and the free layer 138.

Figure 14:
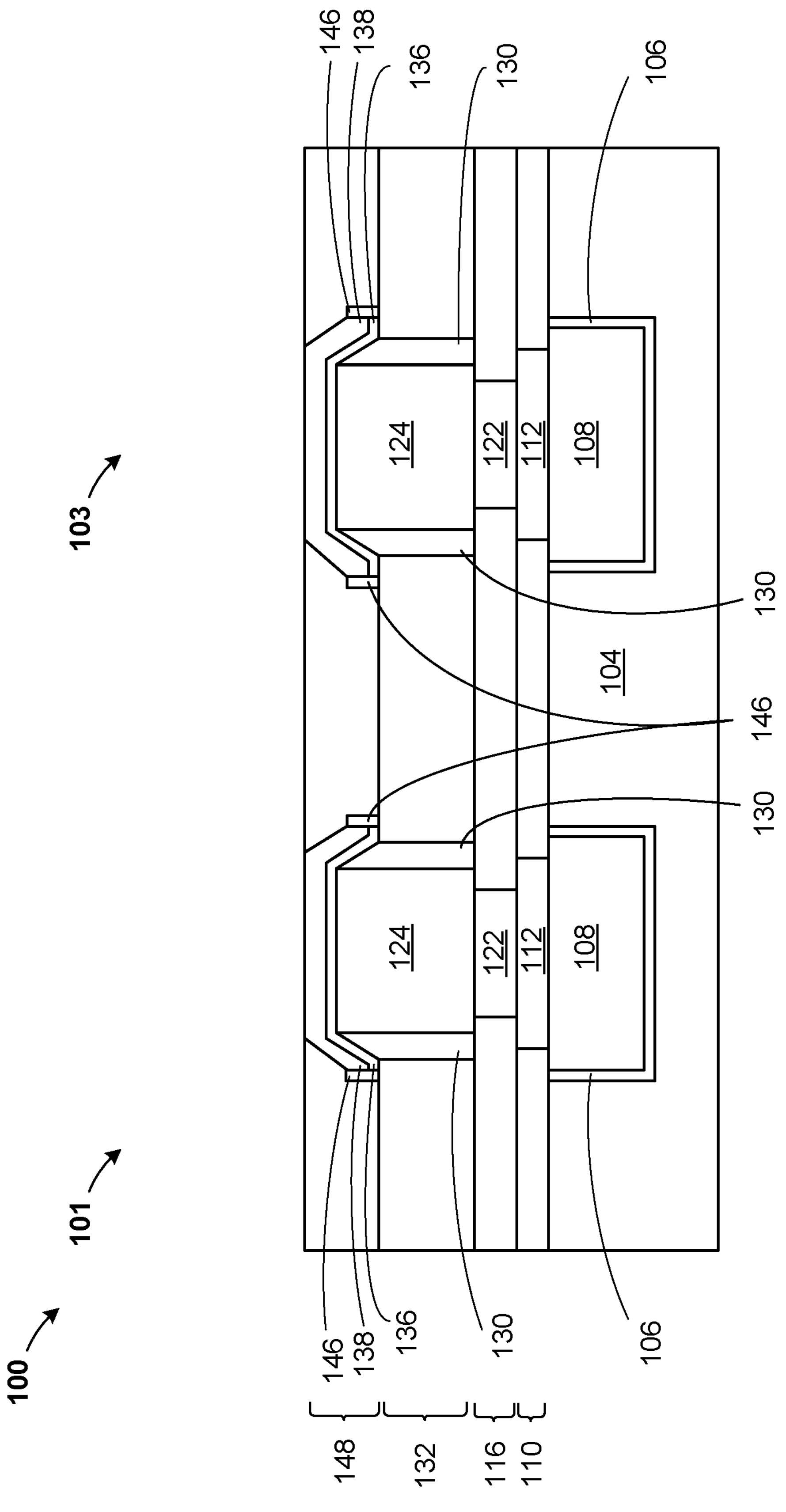
FIG. 14 illustrates a cross-sectional view of the multi-state memory cell and illustrates removal of portions of the second encapsulation layer and formation of a third inter-layer dielectric, according to an exemplary embodiment.

Referring now to FIG. 14, a cross-sectional view of the structure 100 is shown, according to an embodiment. Portions of the second encapsulation layer 146 may be removed. An inter-layer dielectric (hereinafter "ILD") 148 may be formed.

The portions of the second encapsulation layer 146 may be selectively removed using an anisotropic etching technique, such as, for example, reactive ion etching. The remaining portions of the second encapsulation layer 146 may remain vertically aligned directly adjacent to the free layer 138 and the tunneling barrier 136, in both the cells 101, 103. The second encapsulation layer 146 may be removed from upper horizontal surfaces and the overhang of the free layer 138 and from upper horizontal surfaces of the ILD 132.

The ILD 148 may be formed as described for the ILD 104, conformally on the structure 100, covering vertical side surfaces and upper horizontal surfaces of the second encapsulation layer 146, upper horizontal surfaces of the free layer 138, and upper horizontal surfaces of the ILD 132. The ILD 148 is unlikely to contain voids as the ILD 148 is blanket deposited on the structure 100 and fills openings between adjacent free layers 138 and the second encapsulation layer 146 between cells 101, 103. This is less likely to contain voids than forming an inter-layer dielectric surrounding multiple layers of the cell 101, 103.

A planarization process, such as, for example, chemical mechanical polishing (CMP), may be done to remove excess material from a top surface of the structure 100 such that upper horizontal surfaces of the ILD 148 and the free layer 138 are coplanar.

Figure 15:
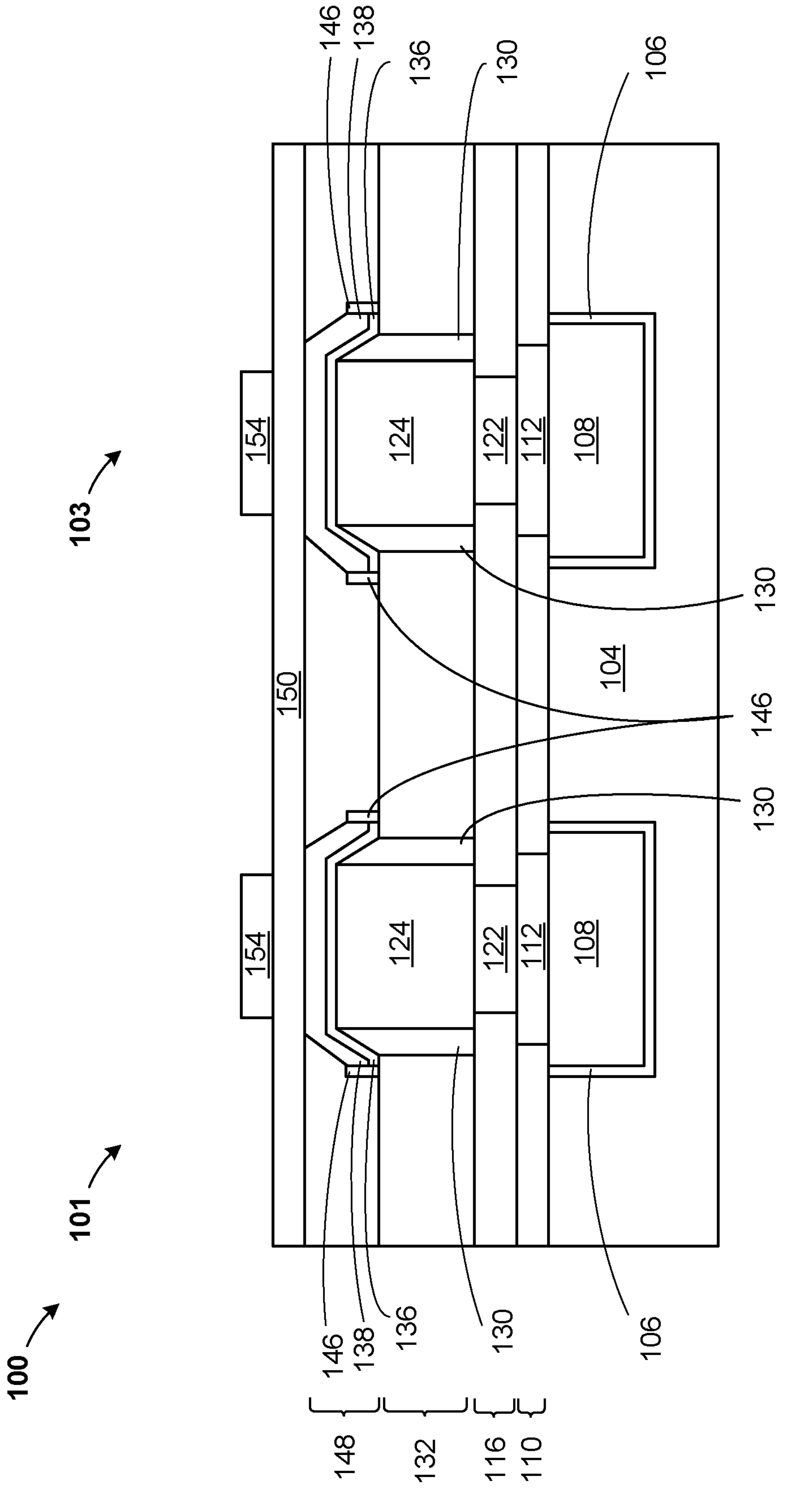
FIG. 15 illustrates a cross-sectional view of the multi-state memory cell and illustrates formation of a top electrode, according to an exemplary embodiment.

Referring now to FIG. 15, a cross-sectional view of the structure 100 is shown, according to an embodiment. A top electrode 150 may be formed. A hard mask 154 may be formed.

The top electrode 150 is formed from a conductive material layer which is blanket deposited on top of the structure 100, and directly on a top surface of the free layer 138 and the ILD 148. The conductive material layer may include materials such as, for example, tantalum nitride (TaN), tantalum (Ta), titanium (Ti), titanium nitride (TiN). The conductive material layer may be deposited using typical deposition techniques, for example, physical vapor deposition, atomic layer deposition, molecular layer deposition, and chemical vapor deposition.

The hard mask 154 may formed on the structure 100 and patterned, directly on an upper horizontal surface of the top electrode 150. The hard mask 154 may be patterned such that remaining portions of the hard mask 154 are vertically aligned above the free layer 138, the tunneling barrier 136, the reference layer 124, the bottom electrode 122, the metal cap 112 and the lower metal wire 108, in both the cells 101, 103.

The second encapsulation layer 146 and the overhang from the free layer 138, the tunneling barrier 136 and the ILD 148 protect the TMJ pillar or structure from the formation o the top electrode 150.

Figure 16:
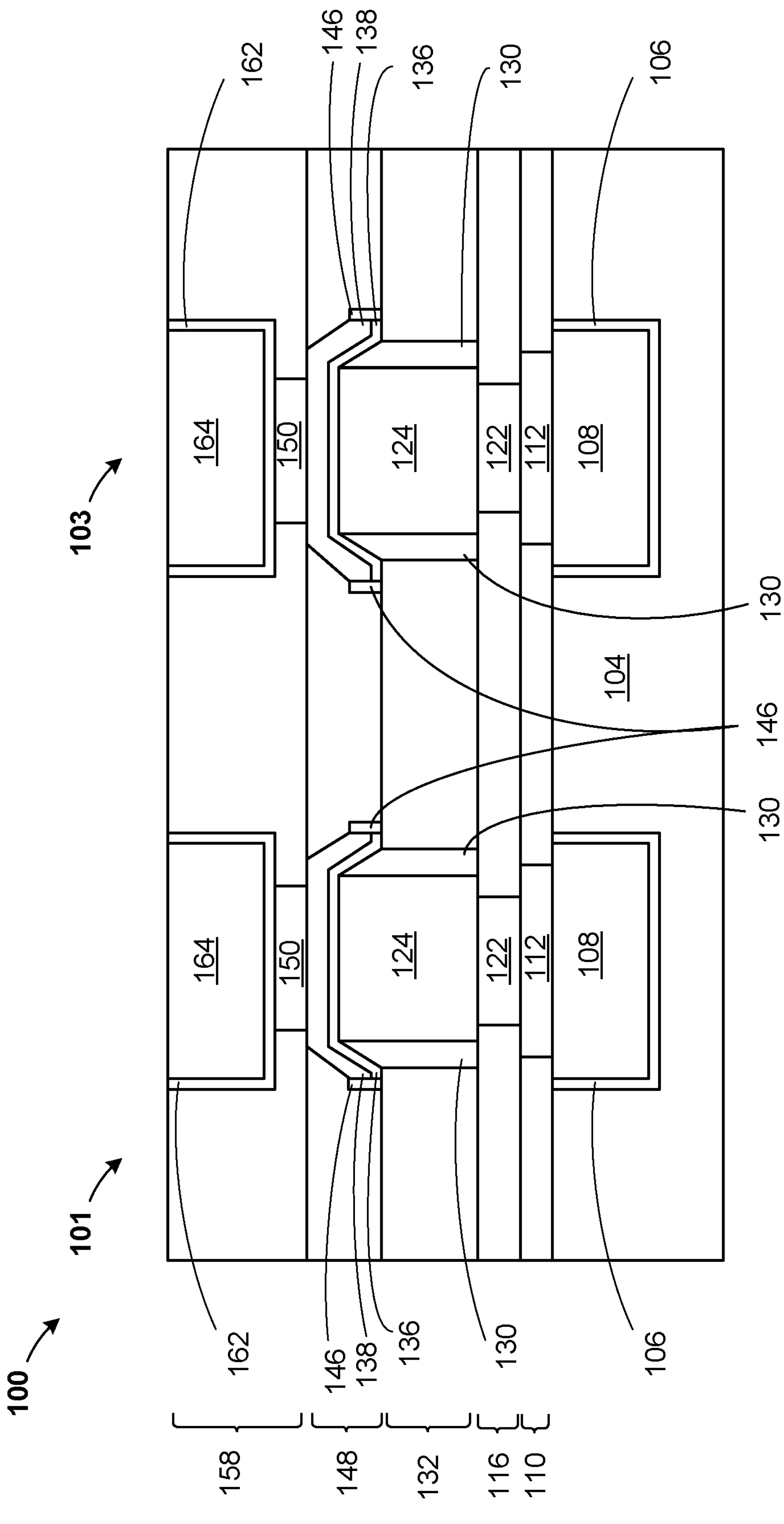
FIG. 16 illustrates a cross-sectional view of the multi-state memory cell and illustrates formation of a fourth inter-layer dielectric and an upper metal wire, according to an exemplary embodiment.

Referring now to FIG. 16, a cross-sectional view of the structure 100 is shown, according to an embodiment. Portions of the top electrode 150 may be removed. The hard mask 154 may be removed. An inter-layer dielectric (hereinafter "ILD") 158 may be formed. A liner 162 may be formed. An upper metal wire 164 may be formed.

Portions of the top electrode 150 may be removed selective to the hard mask 154, the ILD 148 and the free layer 138. In an embodiment, the top electrode 150 may have a thickness ranging from about 10 nm to about 100 nm, although a thickness less than 10 nm and greater than 100 nm may be acceptable. The bottom electrode 122 is vertically aligned above the free layer 138, the tunneling barrier 136, the reference layer 124, the bottom electrode 122, the metal cap 112 and the lower metal wire 108, in both the cells 101, 103.

The ILD 158 may be formed as described for the ILD 104, conformally on the structure 100, covering vertical side surfaces and upper horizontal surfaces of the top electrode 150, and upper horizontal surfaces of the ILD 148. The ILD 158 is unlikely to contain voids as the ILD 158 is blanket deposited on the structure 100 and fills openings between adjacent top electrodes 150 between cells 101, 103. This is less likely to contain voids than forming an inter-layer dielectric surrounding multiple layers of the cell 101, 103.

The upper metal wire 164 may be formed by first patterning two or more trenches (not shown) into the ILD 148, lining the two or more trenches with the liner 152, and filling the two or more trenches.

The liner 162 separates the conductive interconnect material of the upper metal wire 164 from the ILD 158. The liner 162 may be formed as described for the liner 106. The liner 162 surround a lower horizontal surface and a vertical side surface of the upper metal wire 164.

The upper metal wire 164 may be formed as described for the lower metal wire 108. There may be any number of openings in the ILD 168, each lined with the liner 162 and the upper metal wire 156, on the structure 100.

A planarization process, such as, for example, chemical mechanical polishing (CMP), may be done to remove excess material from a top surface of the structure 100 such that upper horizontal surfaces of the upper metal wire 164, the liner 162 and the ILD 158 are coplanar.

The present invention relates to fabricating a MTJ device with a tunneling barrier 136 and a free layer 138 overhang. The tunneling barrier 136 and the free layer 138 each include three connected segments, including a straight inner segment and two curved outer segments surrounding the straight inner segment. The tunneling barrier 136 and the free layer 138 are each wider than the reference layer 124. The first encapsulation layer 130 surrounding the reference layer 124 has a curved or tapered top surface. The tunneling barrier 136 covers an upper horizontal surface of the reference layer 124 and extends beyond the reference layer 124, also covering the upper horizontal surface of the curved encapsulation layer 124. The free layer 138 covers an upper horizontal surface of the tunneling barrier 136, following the same curve as the curved first encapsulation layer 130.

The tunneling barrier 136 and the free layer 138 are wider than the reference layer 124 and prevent metal re-sputtering from the bottom electrode 122. The bottom electrode 122 is protected by the ILD 116 surrounding the bottom electrode 122, by the first encapsulation layer 130 surrounding the reference layer 124, the ILD 132 surrounding the first encapsulation layer 130 surrounding the reference layer 124, and by the overhang of the tunneling barrier 136 and the free layer 138.

The second encapsulation layer 146 surrounds a vertical side surface of both the tunneling barrier 136 and the free layer 138. The ILD 148 surrounds the tunneling barrier 136, the free layer 138 and the second encapsulation layer 146 surrounding the vertical side surface of both the tunneling barrier 136 and the free layer 138. The second encapsulation layer 146 and the ILD 148 protect the MTJ stack during the formation of the top electrode 150.

The overhang of the tunneling barrier 136 and the free layer 138 helps to reduce ILD voiding between adjacent MTJ stacks. This helps to extend scalability of MRAM device memory elements due to void-free gap fill between MRAM pillars and improved embedded MRAM performance due to reduced top contact shorts.

Additionally, the structure 100 has inter-layer dielectric layers formed separately, with the ILD 116 surrounding the bottom electrode 122, the ILD 132 surrounding the first encapsulation layer 146 which surrounds the reference layer 124, the ILD 148 surrounding the second encapsulation layer 146, the tunneling barrier 136 and the free layer 138, and the ILD 158 surrounding the top electrode 150. Each of the ILDs 116, 132, 148, 158 are formed individually and have less voiding of an inter-layer dielectric formed at one time for a same total volume of ILD for the entire MTJ stack, for each cell 101, 103.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:

a magnetic tunnel junction (MTJ) stack, wherein a tunneling barrier of the MTJ stack is wider than a reference layer of the MTJ stack; and a first encapsulation layer located around the reference layer, wherein the first encapsulation layer has an interior vertical side surface that is in direct contact with the reference layer, wherein the tunnel barrier extends laterally past an outer vertical side surface of the first encapsulation layer, wherein the interior vertical side surface and the outer vertical side surfaces are located on opposite sides of the first encapsulation layer, wherein the first encapsulation layer has a slanted upper surface.

2. The semiconductor device according to claim 1, further comprising:

the MTJ stack comprises vertically aligned layers of a top electrode, a free layer, the tunneling barrier, the reference layer and a bottom electrode.

3. The semiconductor device according to claim 2, wherein the free layer is wider than the reference layer.

4. The semiconductor device according to claim 2, wherein a width of the free layer is equal to a width of the tunneling barrier.

5. The semiconductor device according to claim 1, wherein a lowermost portion of the tunneling barrier is below an uppermost portion of the reference layer.

6. The semiconductor device according to claim 2, wherein a lowermost portion of the free layer is below an uppermost portion of the reference layer.

7. The semiconductor device according to claim 2, further comprising:

a second encapsulation layer surrounding vertical side surfaces of the free layer and the tunneling barrier.

8. The semiconductor device according to claim 2, further comprising:

a first inter-layer dielectric surrounding the bottom electrode;

a second inter-layer dielectric surrounding the reference layer;

a third inter-layer dielectric surrounding the free layer and the tunneling barrier; and a fourth inter-layer dielectric surrounding the top electrode.

9. A semiconductor device comprising:

a magnetic tunnel junction (MTJ) stack, wherein a tunneling barrier of the MTJ stack is wider than a reference layer of the MTJ stack, wherein the tunneling barrier comprises a center portion and two outer portions, wherein the center portion is on an upper horizontal portion of the reference layer; and a first encapsulation layer located around the reference layer, wherein the first encapsulation layer has an interior vertical side surface that is in direct contact with the reference layer, wherein the tunnel barrier extends laterally past an outer vertical side surface of the first encapsulation layer, wherein the interior vertical side surface and the outer vertical side surfaces are located on opposite sides of the first encapsulation layer, wherein the first encapsulation layer has a slanted upper surface.

10. The semiconductor device according to claim 9, further comprising:

the MTJ stack comprises vertically aligned layers of a top electrode, a free layer, the tunneling barrier, the reference layer and a bottom electrode.

11. The semiconductor device according to claim 10, wherein the free layer is wider than the reference layer.

12. The semiconductor device according to claim 10, wherein a width of the free layer is equal to a width of the tunneling barrier.

13. The semiconductor device according to claim 9, wherein a lowermost portion of the tunneling barrier is below an uppermost portion of the reference layer.

14. The semiconductor device according to claim 10, wherein a lowermost portion of the free layer is below an uppermost portion of the reference layer.

15. The semiconductor device according to claim 10, further comprising:

a second encapsulation layer surrounding vertical side surfaces of the free layer and the tunneling barrier.

16. The semiconductor device according to claim 10, further comprising:

a first inter-layer dielectric surrounding the bottom electrode;

a second inter-layer dielectric surrounding the reference layer;

a third inter-layer dielectric surrounding the free layer and the tunneling barrier; and a fourth inter-layer dielectric surrounding the top electrode.

17. A method comprising:

forming a magnetic tunnel junction (MTJ) stack, wherein a tunneling barrier of the MTJ stack is wider than a reference layer of the MTJ stack; and forming an encapsulation layer located around the reference layer, wherein the encapsulation layer has an interior vertical side surface that is in direct contact with the reference layer, wherein the tunnel barrier extends laterally past an outer vertical side surface of the encapsulation layer, wherein the interior vertical side surface and the outer vertical side surfaces are located on opposite sides of the encapsulation layer, wherein the first encapsulation layer has a slanted upper surface.

18. The method according to claim 17, wherein the tunneling barrier comprises a center portion and two outer portions, wherein the center portion is on an upper horizontal portion of the reference layer, and the two outer portions are on a slanted upper surface of an encapsulation layer surrounding the reference layer.

* * * * *